United States Patent
Watson

(10) Patent No.: US 7,717,966 B2
(45) Date of Patent: May 18, 2010

(54) BARRIER ASSEMBLY FOR AN EXPOSURE APPARATUS

(75) Inventor: Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 133 days.

(21) Appl. No.: 11/126,444

(22) Filed: May 10, 2005

(65) Prior Publication Data

US 2006/0258153 A1   Nov. 16, 2006

(51) Int. Cl.
*H01L 21/00* (2006.01)
*F16L 11/22* (2006.01)

(52) U.S. Cl. .................. 29/25.01; 138/137; 138/148

(58) Field of Classification Search ............. 355/53, 355/72, 75; 29/25.01; 138/137, 148
See application file for complete search history.

(56) References Cited

U.S. PATENT DOCUMENTS

| | | | |
|---|---|---|---|
| 5,983,950 A * | 11/1999 | Aoki et al. ............... | 138/109 |
| 6,153,044 A | 11/2000 | Klebanoff et al. | |
| 6,253,464 B1 | 7/2001 | Klebanoff et al. | |
| 6,333,775 B1 | 12/2001 | Haney et al. | |
| 6,549,264 B2 | 4/2003 | Haney et al. | |
| 6,600,547 B2 | 7/2003 | Watson et al. | |
| 6,603,130 B1 | 8/2003 | Bisschops et al. | |
| 6,614,508 B2 | 9/2003 | Phillips et al. | |
| 2001/0023522 A1* | 9/2001 | Watson et al. ............... | 29/25.01 |
| 2002/0093634 A1 | 7/2002 | Watson et al. | |
| 2002/0163630 A1 | 11/2002 | Bisschops et al. | |
| 2004/0000215 A1 | 1/2004 | Phillips et al. | |
| 2004/0004702 A1 | 1/2004 | Phillips et al. | |
| 2004/0065517 A1 | 4/2004 | Watson et al. | |
| 2005/0011573 A1* | 1/2005 | Chahine et al. ............. | 138/148 |

FOREIGN PATENT DOCUMENTS

| | | |
|---|---|---|
| JP | 2002-015738 | 1/2000 |
| JP | 2004-214527 A | 7/2004 |

OTHER PUBLICATIONS

U.S. Appl. No. 10/349,421, filed Jan. 21, 2003, Watson.
US Publication No. 2001-0023522 A1 (now abandoned) is the counterpart to the Japanese application No. 2002/015738. The 2001-0023522 A1 is believed to be the English translation for the Japanese application.

* cited by examiner

*Primary Examiner*—Peter B Kim
*Assistant Examiner*—Chia-how Michael Liu
(74) *Attorney, Agent, or Firm*—Roeder & Broder LLP

(57) ABSTRACT

A barrier assembly (58) for sealing an assembly gap (274) between a first assembly (266) and a second assembly (268) includes a first barrier (270) that seals the assembly gap (274) and a second barrier (272) that seals the assembly gap (274). The barriers (270) (272) can be spaced apart. Further, the first barrier(270) provides a flexible pressure barrier that seals the assembly gap (274) and the second barrier (272) provides a flexible barrier that inhibits the first barrier (270) from contaminating a chamber environment within the assemblies (266) (268). Additionally, the barrier assembly (58) includes a barrier source (62) that controls a barrier environment between the barriers (270) (272).

40 Claims, 8 Drawing Sheets

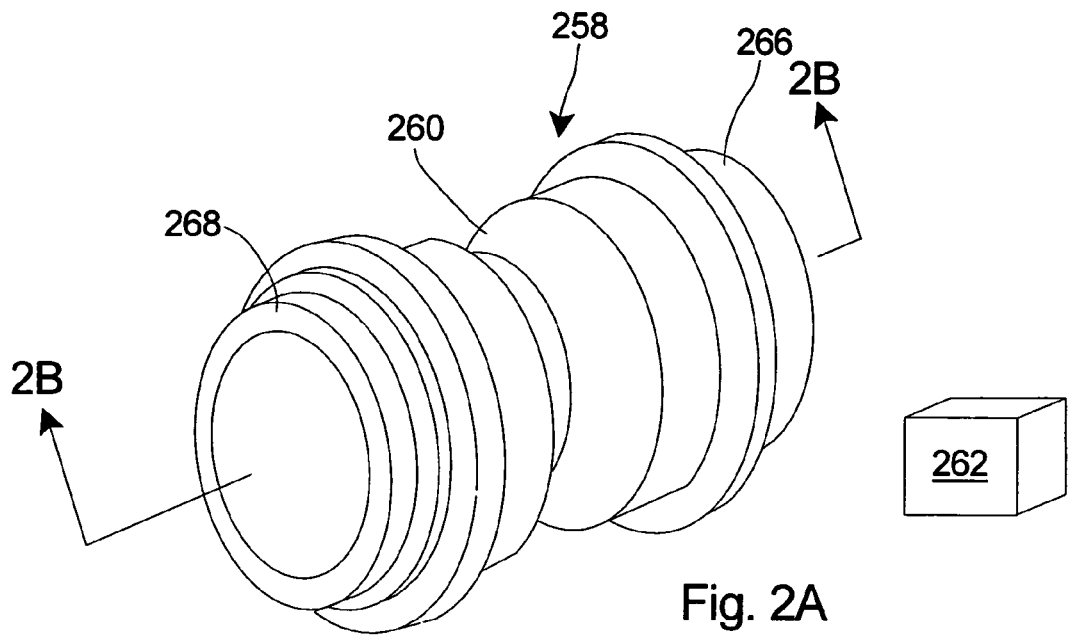
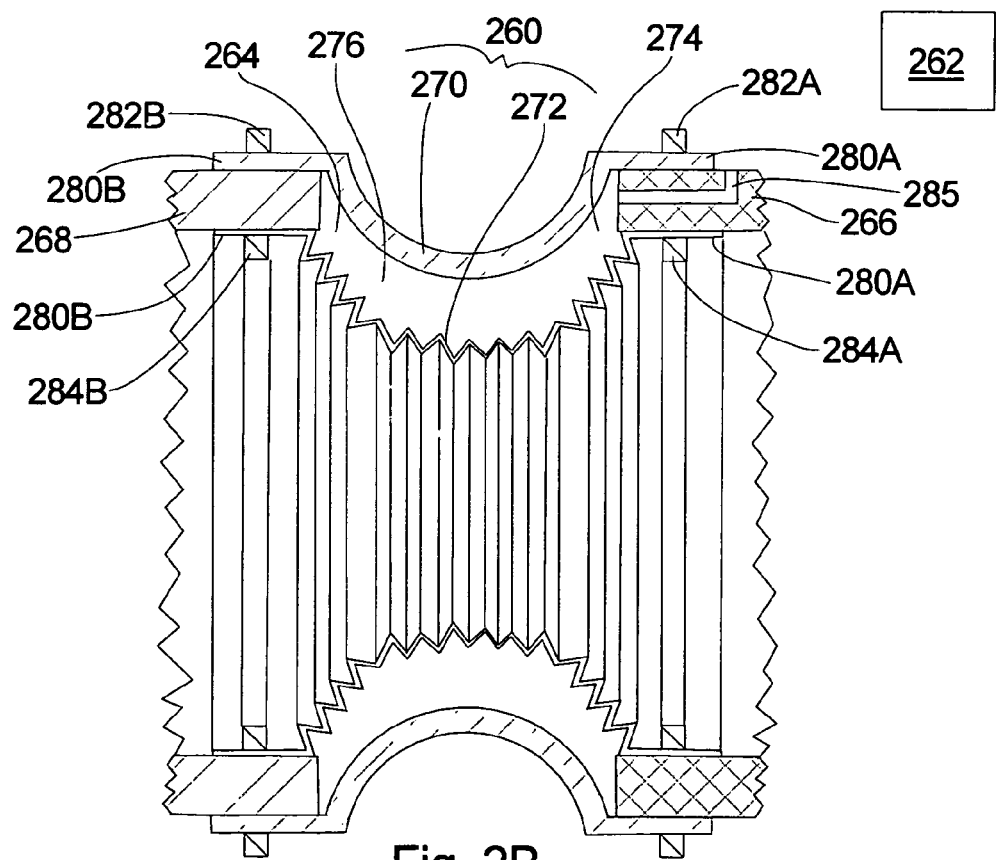

BARRIER ASSEMBLY FOR AN EXPOSURE APPARATUS

BACKGROUND

Exposure apparatuses are commonly used to transfer images from a reticle onto a semiconductor wafer during semiconductor processing. A typical exposure apparatus includes an illumination source, a reticle stage assembly that positions a reticle, an optical assembly, a wafer stage assembly that positions a semiconductor wafer, and a measurement system that precisely monitors the position of the reticle and the wafer.

The illumination source generates a beam of light energy that is directed at the reticle. The projection optical assembly directs and/or focuses the light energy from the reticle to the wafer. The reticle stage assembly positions the reticle relative to the projection optical assembly. Similarly, the wafer stage assembly positions the wafer relative to the projection optical assembly.

Depending upon the wavelength of the light energy generated by the illumination source, the type of fluid between the illumination source and the wafer can greatly influence the performance of the exposure apparatus. For example, some types of light energy are absorbed by oxygen and other gases. Absorption of the light energy can lead to losses of intensity and uniformity of the light energy. Accordingly, the performance of the exposure apparatus and the quality of the integrated circuits formed on the wafer can be enhanced by controlling the environment around the reticle and/or wafer.

One way to control the environment includes positioning a reticle chamber assembly around the reticle and a wafer chamber assembly around the wafer. Subsequently, the desired environment can be created within the chamber assemblies. In certain designs, each chamber assembly can include a first assembly, a second assembly, and a relatively stiff and rigid mechanical bellows that seals the first assembly to the second assembly. Unfortunately, with the stiff and rigid bellows, vibration from one of the assemblies is readily transferred to the other one of the assemblies. Further, the stiff and rigid bellows only provide limited range of relative movement between the assemblies.

SUMMARY

The present invention is directed to a barrier assembly for sealing an assembly gap between a first assembly and a second assembly. In one embodiment, the barrier assembly includes a first barrier that extends across the assembly gap between the first assembly and the second assembly, and a second barrier that extends across the assembly gap between the first assembly and the second assembly, the second barrier being made of a different material than the first barrier.

In one embodiment, the first barrier provides a flexible pressure barrier that seals the assembly gap and the second barrier provides a flexible barrier that inhibits the first barrier from contaminating a chamber environment within the assemblies.

In one embodiment, the barriers are spaced apart. In this embodiment, the barrier assembly can include a barrier source that controls a barrier environment between the barriers.

In yet another embodiment, the barrier assembly includes a seal for selectively sealing the assembly gap in the event one of the barriers fails.

The present invention is also directed to a chamber assembly that includes the barrier assembly, an exposure apparatus the includes the barrier assembly, a wafer, a device, a method for sealing an assembly gap, a method for making an exposure apparatus, a method for making a device, and a method for manufacturing a wafer.

BRIEF DESCRIPTION OF THE DRAWINGS

FIG. 2A is a perspective view of a portion of a first assembly, a portion of a second assembly and a portion of a barrier assembly having features of the present invention;

FIG. 2B is a cut-away view taken on line 2B-2B in FIG. 2A;

DESCRIPTION

Figure 1:
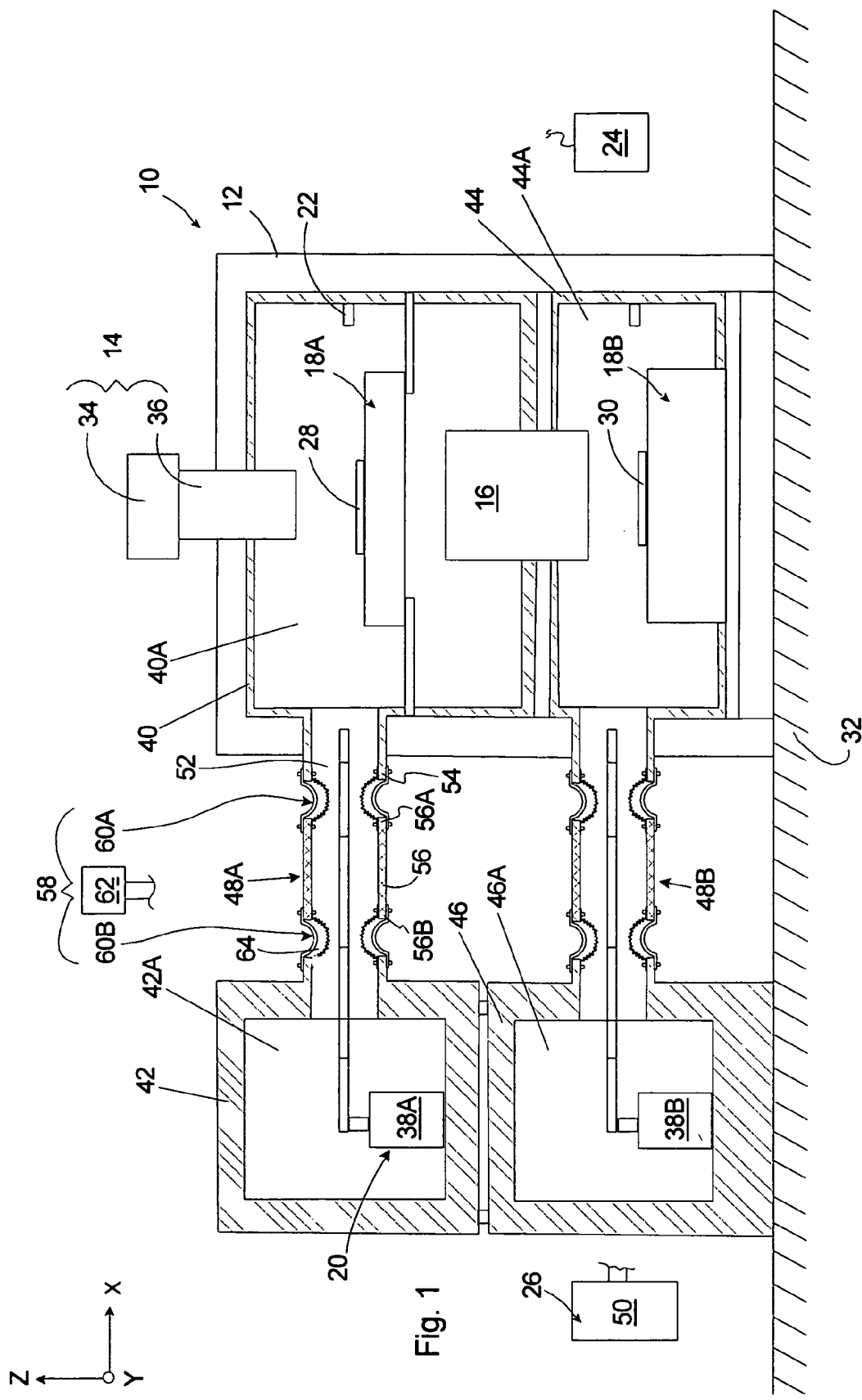
FIG. 1 is a side illustration of an exposure apparatus, in partial cut-away, having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a first stage assembly 18A, a second stage assembly 18B, a loader assembly 20, a measurement system 22, a control system 24, and an environmental system 26. The design of the components of the exposure apparatus 10 can be varied to suit the design requirements of the exposure apparatus 10.

A number of Figures include an orientation system that illustrates an X axis, a Y axis that is orthogonal to the X axis, and a Z axis that is orthogonal to the X and Y axes. It should be noted that these axes can also be referred to as the first, second and third axes.

In one embodiment, the exposure apparatus 10 is useful as a lithographic device that transfers a pattern (not shown) of an integrated circuit from a reticle 28 onto a semiconductor wafer 30 (illustrated in phantom). The reticle 28 and/or the wafer 30 are also referred to generally as a device. The exposure apparatus 10 mounts to a mounting base 32, e.g., the ground, a base, or floor or some other supporting structure.

There are a number of different types of lithographic devices. For example, the exposure apparatus 10 can be used as a scanning type photolithography system that exposes the pattern from the reticle 28 onto the wafer 30 with the reticle 28 and the wafer 30 moving synchronously. In a scanning type lithographic apparatus, the reticle 28 is moved perpendicularly to an optical axis of the optical assembly 16 by the reticle stage assembly 18A and the wafer 30 is moved perpendicularly to the optical axis of the optical assembly 16 by the wafer stage assembly 18B. Scanning of the reticle 28 and the wafer 30 occurs while the reticle 28 and the wafer 30 are moving synchronously.

Alternatively, the exposure apparatus 10 can be a step-and-repeat type photolithography system that exposes the reticle 28 while the reticle 28 and the wafer 30 are stationary. In the step and repeat process, the wafer 30 is in a constant position relative to the reticle 28 and the optical assembly 16 during the exposure of an individual field. Subsequently, between consecutive exposure steps, the wafer 30 is consecutively moved with the wafer stage assembly 18B perpendicularly to the optical axis of the optical assembly 16 so that the next field of the wafer 30 is brought into position relative to the optical assembly 16 and the reticle 28 for exposure. Following this process, the images on the reticle 28 are sequentially exposed onto the fields of the wafer 30, and then the next field of the wafer 30 is brought into position relative to the optical assembly 16 and the reticle 28.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The apparatus frame 12 supports some of the components of the exposure apparatus 10. The apparatus frame 12 illustrated in FIG. 1 supports the reticle stage assembly 18A, the optical assembly 16 and the illumination system 14 above the mounting base 32.

The illumination system 14 includes an illumination source 34 and an illumination optical assembly 36. The illumination source 34 emits a beam (irradiation) of light energy. The illumination optical assembly 36 guides the beam of light energy from the illumination source 34 to the reticle 28. In FIG. 1, the illumination system 14 is illustrated as being supported above the reticle stage assembly 18A. In this embodiment, the energy beam from the illumination system 14 is directed through the reticle 28 to the optical assembly 16. Alternatively, for example, the illumination system 14 can be positioned elsewhere.

The illumination source 34 can be a g-line source (436 nm), an i-line source (365 nm), a KrF excimer laser (248 nm), an ArF excimer laser (193 nm) or a $F_2$ laser (157 nm). Alternatively, the illumination source 34 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of the reticle 16 and the optical assembly 16.

The optical assembly 16 projects and/or focuses the light from the reticle 28 to the wafer 30. Depending upon the design of the exposure apparatus 10, the optical assembly 16 can magnify or reduce the image illuminated on the reticle 28. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or reflective (a reticle should also preferably be a reflective type), and when an electron beam is used, electron optics can consist of magnetic lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No, 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Patent Application No. 873,605 (Application Date: 6-12-97) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The first stage assembly 18A holds and positions the reticle 28 relative to the optical assembly 16 and the wafer 30. In one embodiment, the first stage assembly 18A includes a reticle stage (not shown) that retains the reticle 28, and a reticle stage mover assembly (not shown) that moves and positions the reticle stage and reticle 28.

The second stage assembly 18B holds and positions the wafer 30 with respect to the projected image of the illuminated portions of the reticle 28. In one embodiment, the second stage assembly 18B includes a wafer stage (not shown) that retains the wafer 30, and a wafer stage mover assembly (not shown) that moves and positions the wafer stage and the wafer 28 relative to the optical assembly 16.

In photolithography systems, when linear motors (see U.S. Pat. No. 5,623,853 or U.S. Pat. No. 5,528,118) are used in the wafer stage assembly or the reticle stage assembly, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage base and the other unit is mounted on the moving plane side of the stage.

Movement of the stages generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The loader assembly 20 loads and removes the reticle 28 from the reticle stage and/or the wafer 30 from the wafer stage. In the embodiment illustrated in FIG. 1, the loader assembly 20 includes a first loader 38A for selectively loading and removing reticles 28 from the reticle stage and a second loader 38B for selectively loading and removing wafers 30 from the wafer stage. Each loader 38A, 38B can include one or more actuators and robotic arms.

The measurement system 22 monitors movement of the reticle 28 and the wafer 30 relative to the optical assembly 16 or some other reference. With this information, the control system 24 can control the first stage assembly 18A to precisely position the reticle 28 and the second stage assembly 18B to precisely position the wafer 30. The design of the measurement system 22 can vary. For example, the measurement system 22 can utilize multiple laser interferometers, encoders, mirrors, and/or other measuring device.

The control system 24 is electrically connected to the environmental system 26, the measurement system 22 and the stage assemblies 18A, 18B. In one embodiment, the control system 24 receives information from the measurement system 22 and controls the stage mover assemblies to precisely position the reticle 28 and the wafer 30. Additionally, the control system 24 can control the operation of the components of the environmental system 26. The control system 24 can include one or more processors and circuits.

The environmental system 26 provides a controlled chamber environment around the reticle 28, the wafer 30, the first loader 38A, and/or the second loader 38B. In the embodiment illustrated in FIG. 1, the environmental system 26 includes (i) a first reticle chamber assembly 40 that encircles, encloses, and defines a first reticle chamber 40A around the reticle 28 and the reticle stage, (ii) a second reticle chamber assembly 42 that encircles, encloses, and defines a second reticle chamber 42A around the first loader 38A, (iii) a first wafer chamber assembly 44 that encircles, encloses, and defines a first wafer chamber 44A around the wafer 30 and the wafer stage, (iv) a second wafer chamber assembly 46 that encircles, encloses, and defines a second wafer chamber 46A around the second loader 38B, (v) a reticle connector assembly 48A (vi) a wafer connector assembly 48B, and (vii) an environmental source 50.

Each chamber assembly 40, 42, 44, 46 can be sized and shaped according to the design of the other components of the exposure apparatus 10. In FIG. 1, each chamber assembly 40, 42, 44, 46 is generally rectangular box shaped. In one embodiment, each chamber assembly 40, 42, 44, 46 is rigid and is constructed from materials such as metal or plastic. The required thickness and strength of each chamber assembly 40, 42, 44, 46 will depend upon type of controlled environment. For example, thicker and stronger walls are necessary if the controlled environment is a vacuum.

In FIG. 1, each of the chamber assemblies 40, 42, 44, 46 includes a chamber opening 52. The chamber openings 52 of the reticle chamber assemblies 40, 42 allows the first loader 38A to extend from the second reticle chamber assembly 42 into the first reticle chamber assembly 40. Somewhat similarly, the chamber openings 52 of the wafer chamber assemblies 44, 46 allows the second loader 38B to extend from the second wafer chamber assembly 46 into the first wafer chamber assembly 44. In one embodiment, each chamber opening 52 is defined by a tubular shaped chamber housing 54.

Additionally, one or more of the chamber assemblies 40, 42, 44, 46 can include one or more additional openings for receiving a portion of the illumination system 14, for receiving a portion of the optical assembly 16, for accessing the components in the chamber assemblies 40, 42, 44, 46, and/or for connecting the chamber assemblies 40, 42, 44, 46 in fluid communication with the environmental source 50. One or more mechanical bellows (not shown) can be used to seal the illumination system 14, and/or the optical assembly 16 to the one or more of the chamber assemblies 40, 42, 44, 46. Alternatively, for example, one or more of the barriers discussed below can be used.

The reticle connector assembly 48A connects the chamber housings 54 of the reticle chamber assemblies 40, 42 together in fluid communication. Additionally, in one embodiment, the reticle connector assembly 48A allows for relative movement of the reticle chamber assemblies 40, 42 and inhibits vibration from one of the reticle chamber assemblies 40, 42 from causing vibration on the other reticle chamber assembly 42, 40.

Somewhat similarly, the wafer connector assembly 48B connects the chamber housing 54 of the wafer chamber assemblies 44, 46 together in fluid communication. Additionally, in one embodiment, the wafer connector assembly 48B allows for relative movement of the wafer chamber assemblies 44, 46 and inhibits vibration from one of the wafer chamber assemblies 44, 46 from causing vibration on the other wafer chamber assembly 46, 44.

In this embodiment, each connector assembly 48A, 48B includes an intermediate assembly 56, and a barrier assembly 58. In one embodiment, the intermediate assembly 56 includes a generally annular tube shaped housing having a first end 56A and a second end 56B. Further, in this embodiment, the barrier assembly 58 includes a first barrier subassembly 60A, a second barrier subassembly 60B, and a barrier source 62. The combination of the intermediate assembly 56 and the spaced apart barrier subassemblies 60A, 60B allow for relative movement of the chamber assemblies. Stated another way, the intermediate assembly 56 between the barrier subassemblies 60A, 60B reduces lateral stiffness. Alternatively, for example, one or both connector assemblies 48A, 48B could be designed without the intermediate assembly 56, the first barrier subassembly 60A, the second barrier subassembly 60B, and/or the barrier source 62.

For the reticle connector assembly 48A, the first barrier subassembly 60A seals the first end 56A of the intermediate assembly 56 to the first reticle chamber assembly 40 and the second barrier subassembly 60B seals the second end 56B of the intermediate assembly 56 to the second reticle chamber assembly 42. Somewhat similarly, for the wafer connector assembly 48B, the first barrier subassembly 60A seals the first end 56A of the intermediate assembly 56 to the first wafer chamber assembly 44 and the second barrier subassembly 60B seals the second end 56B of the intermediate assembly 56 to the second wafer chamber assembly 46. Additionally, in one embodiment, each barrier subassembly 60A, 60B defines a barrier chamber 64.

The barrier source 62 is in fluid communication with the barrier chamber 64 of the first barrier subassembly 60A and/or the second barrier subassembly 60B of each connector assembly 48A, 48B and controls a barrier environment within the barrier chamber 64 of the first barrier subassembly 60A and/or the second barrier subassembly 60B of each connector assembly 48A, 48B.

The barrier source 62 can control the barrier environment to be the same as the chamber environment in the chambers 40A, 42A, 44A, 46A. Alternatively, for example, the barrier environment can be controlled by the barrier source 62 to be different than the chamber environment. As an example, the desired barrier environment can be a vacuum type environment. In this embodiment, the barrier source 62 removes the fluid from one or more of the barrier chambers 64. Alternatively, for example, the controlled barrier environment can be an inert gas, such as Argon, Helium, or Nitrogen, or another type of fluid. In this embodiment, the barrier source 62 fills the barrier chambers 64 with the desired fluid. The barrier source 62 can include one or more pumps, reservoirs, and/or vacuum pumps. Additionally, the barrier source 62 can include multiple separate systems.

The environmental source 50 is in fluid communication with one or more of the chambers 40A, 42A, 44A, 46A and creates the desired chamber environment in one or more of the chambers 40A, 42A, 44A, 46A. The desired chamber environment created and/or controlled in the chambers 40A, 42A, 44A, 46A by the environmental system 26 can be selected according to the design of the rest of the components of the exposure apparatus 10, including the illumination system 14. For example, the desired controlled chamber environment can be a vacuum type environment. In this embodiment, the environmental source 50 removes the fluid from the chambers 40A, 42A, 44A, 46A. Alternatively, for example, the controlled environment can be an inert gas, such as Argon, Helium, or Nitrogen, or another type of fluid. In this embodiment, the environmental source 50 fills the chambers 40A, 42A, 44A, 46A with the desired fluid. The environmental source 50 can include one or more pumps, reservoirs, and/or vacuum pumps. Additionally, the environmental source 50 can include multiple separate systems.

FIG. 2A is a perspective view of a first embodiment of a portion of a first assembly 266, a portion of a second assembly 268 and a portion of a barrier assembly 258 including one barrier subassembly 260 and a barrier source 262. In this embodiment, for example, (i) the first assembly 266 can be the first reticle chamber assembly 40 (illustrated in FIG. 1) and the second assembly 268 can be the intermediate assembly 56 (illustrated in FIG. 1) or the second reticle chamber assembly 42 (illustrated in FIG. 1); or (ii) the first assembly 266 can be the first wafer chamber assembly 44 (illustrated in FIG. 1) and the second assembly 268 can be the intermediate assembly 56 (illustrated in FIG. 1) or the second wafer chamber assembly 46 (illustrated in FIG. 1).

FIG. 2B is a cross-sectional view taken on line 2B-2B in FIG. 2A. In this embodiment, the barrier subassembly 260 includes a first barrier 270 and a spaced second barrier 272. FIG. 2B also illustrates the barrier source 262 and that an assembly gap 274 separates the first assembly 266 from the second assembly 268.

In this embodiment, the first barrier 270 extends across the assembly gap 274 and the second barrier 272 extends across the assembly gap 274. Further, the barriers 270, 272 are spaced apart a barrier gap 276 that defines the barrier chamber 264. In alternative, non-exclusive embodiments, the size of the barrier gap 276 can be approximately 0, 5, 10, 15, 20 or 30 mm. It should be noted that in certain embodiments, if the pressure in the barrier gap 276 is less than the pressure in the assemblies 266, 268, that the barrier gap 276 can be approximately 0 mm.

The orientation and position of the barriers 270, 272 can be varied to suit the design requirements of the barrier assembly 258. In FIG. 2B, the first barrier 270 and the second barrier 272 are each somewhat annular shaped and the first barrier 270 encircles the second barrier 272. In this embodiment, the first barrier 270 can be considered an outer barrier and the second barrier 272 can be considered the inner barrier. Alternatively, for example, one or more of the barriers 270, 272 can have a different shape, such as rectangular frame shaped, or octagonal frame shaped.

Figure 2C:
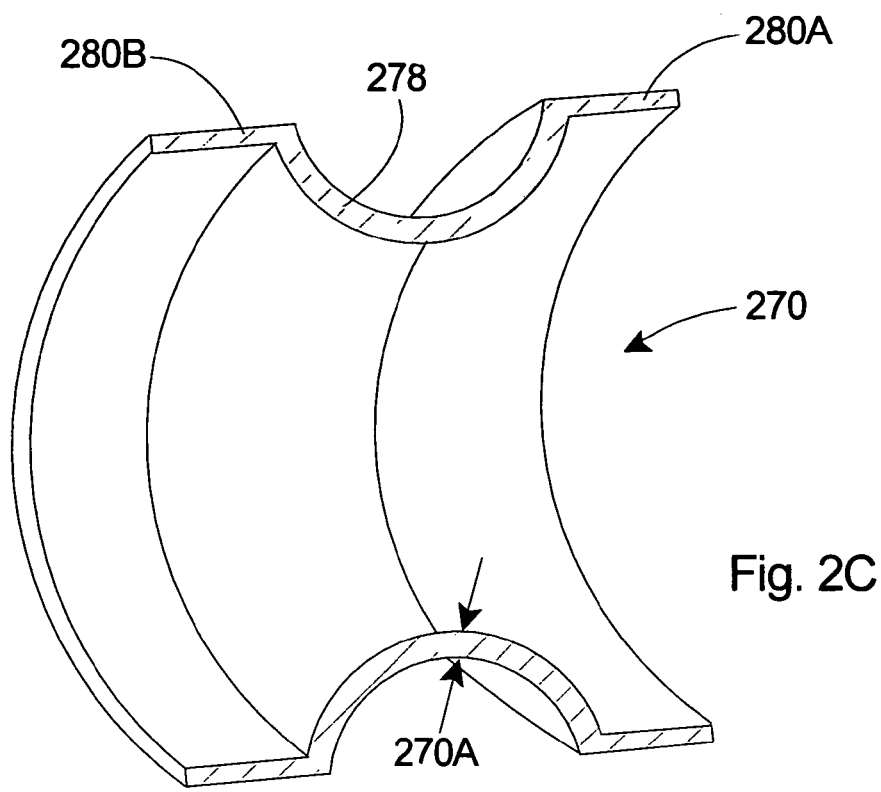
FIG. 2C is a cut-away perspective view of a first barrier having features of the present invention.
Figure 2D:
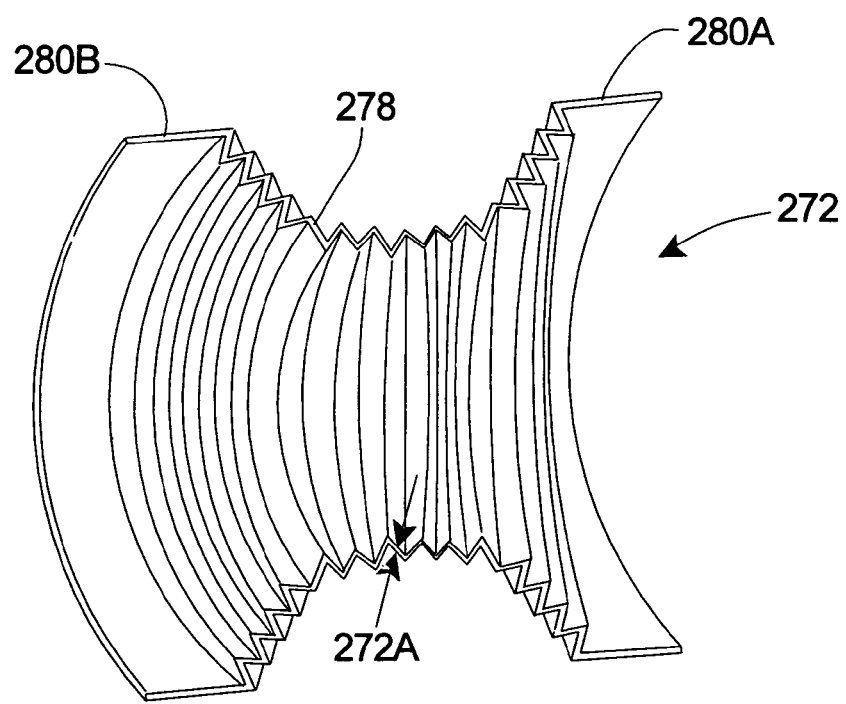
FIG. 2D is a cut-away perspective view of a second barrier having features of the present invention.

FIG. 2C illustrates a perspective cut-away view of the first barrier 270 and FIG. 2D illustrates a perspective cut-away view of the second barrier 272. In this embodiment, each barrier 270, 272 is generally annular shaped and has a cross-sectional shape that includes a somewhat "U" shaped region 278, a generally straight shaped first attachment region 280A, and a generally straight shaped second attachment region 280B. The "U" shaped region 280A separates the attachment regions 280A, 280B. Further, in this embodiment, the first barrier 270 is a convoluted diaphragm type seal and the "U" shaped region 280A is at least partly positioned in the assembly gap 274 (illustrated in FIG. 2B). Alternatively, for example, the first barrier 270 and/or the second barrier 272 can be generally cylindrically shaped. In this design, a portion of barrier 270, 272 can deform inward under pressure.

Moreover, in the embodiment illustrated in FIG. 2D, the "U" shaped region 278 of the second barrier 272 includes a plurality of folds. In FIG. 2D, the folds are somewhat accordion like. Alternatively, the folds can have another configuration or pattern that provides flexibility. Non-exclusive examples of other suitable fold designs can be found in U.S. Pat. No. 6,614,508. As far as is permitted, the disclosures in U.S. Pat. No. 6,614,508 are incorporated herein by reference.

In this embodiment, the first barrier 270 has a first barrier thickness 270A that is greater than a second barrier thickness 272A of the second barrier 272. In non-exclusive, alternative embodiments, the first barrier thickness 270A is at least approximately 1, 5, 10, 20, or 50 percent greater than the second barrier thickness 272A. Alternatively, for example, the first barrier thickness 270A can be equal to or less than the second barrier thickness 272A.

In an alternative embodiment, the first barrier 270 can be supported by "hoops", "rings", or a spiral support (not shown) somewhat similar to a dryer vent hose.

Referring back to FIG. 2B, in this embodiment, the first attachment region 280A of each barrier 270, 272 is secured to the first assembly 266 and the second attachment region 280B of each barrier 270, 272 is secured to the second assembly 268. In one embodiment, for the first barrier 270, an annular shaped, outer first retainer 282A secures the first attachment region 280A to the first assembly 266, and an annular shaped, outer second retainer 282B secures the second attachment region 280B to the second assembly 268. Somewhat similarly, for the second barrier 272, an annular shaped, inner first retainer 284A secures the first attachment region 280A to the first assembly 266, and an annular shaped, inner second retainer 284B secures the second attachment region 280B to the second assembly 268. Alternatively, for example, the barriers 270, 272 can be secured to the assemblies 266, 268 by other means, such as fasteners or an adhesive.

In another embodiment, the attachment regions 280A, 280B of each barrier 270, 272, the retainers 284A, 284B can be conical shaped with the larger diameter directed toward the opening. In this embodiment, the first assembly 266, the second assembly 268, and the retainers 282A, 282B can be also conical shaped. With this design, the assembly and clamping can be accomplished by axially clamping the components.

The materials utilized in the barriers 270, 272 can be varied to suit the chamber environment created by the environmental system 26 (illustrated in FIG. 1). In one embodiment, first barrier 270 is made of a different material than the second barrier 272. For example, the first barrier 270 can be made of a resilient material such as rubber, elastomer, cloth backed rubber, rubber impregnated cloth or other materials and the second barrier 272 can be made of a relatively thin flexible metallic material, foil, mylar, or other material. In one embodiment, the first barrier 270 is made of a flexible material that outgases and the second barrier 272 is made of a clean, somewhat rigid material that does not outgas. Certain types of rubber outgas contaminants that can adversely influence the chamber environment. With the present design, in one embodiment, the first barrier 270 provides a relatively flexible high pressure barrier that seals the assembly gap 274 and the second barrier 272 provides a flexible barrier that inhibits the first barrier 270 from contaminating the chamber environment. With this design, contaminants generated by the first barrier 270 do not contaminate the controlled chamber environment. Moreover, the soft flexible barriers 270, 272 allow for relative movement of the assemblies 266, 268 and inhibit the transfer of vibration between the assemblies 266, 268.

As provided above, the barrier source 262 controls the barrier environment in the barrier chamber 264 between the barriers 270, 272. In one embodiment, the barrier source 262 creates a rough vacuum between the barriers 270, 272. In alternative nonexclusive embodiments, the barrier source 262 controls the barrier pressure in the barrier gap 276 so that the absolute pressure difference between the barrier pressure in the barrier gap 276 and the chamber pressure in the chambers 40A, 42A, 44A, 46A (illustrated in FIG. 1) is less than approximately 0.001, 0.01, 0.1, 0.5, 1, 1.5, 2, or 3 PSI. Stated another way, in alternative nonexclusive embodiments, the barrier pressure in the barrier gap 276 is controlled to be within approximately 0.1, 0.5, 1, 5, 10, 50, or 100 percent of the chamber pressure.

In certain designs, the first barrier 270 supports most or all of the pressure difference and the pressure differential across the second barrier 272 is relatively small. Accordingly, the second barrier 272 can be relatively thin and flexible. Further, any small holes in the second barrier 272 will result in minimal leakage of contaminants into the assemblies 266, 268. If the barrier pressure is maintained to be lower than the chamber pressure, then any leakage of the second barrier 272 will flow into the barrier chamber 264.

As illustrated in FIG. 2B, the first assembly 266 can include a barrier port 285 that is in fluid communication with the barrier chamber 264 and the barrier source 262.

In another embodiment, a typical commercially available convoluted diaphragm type seal can be used with a cylindrical second barrier 272.

Figure 3A:
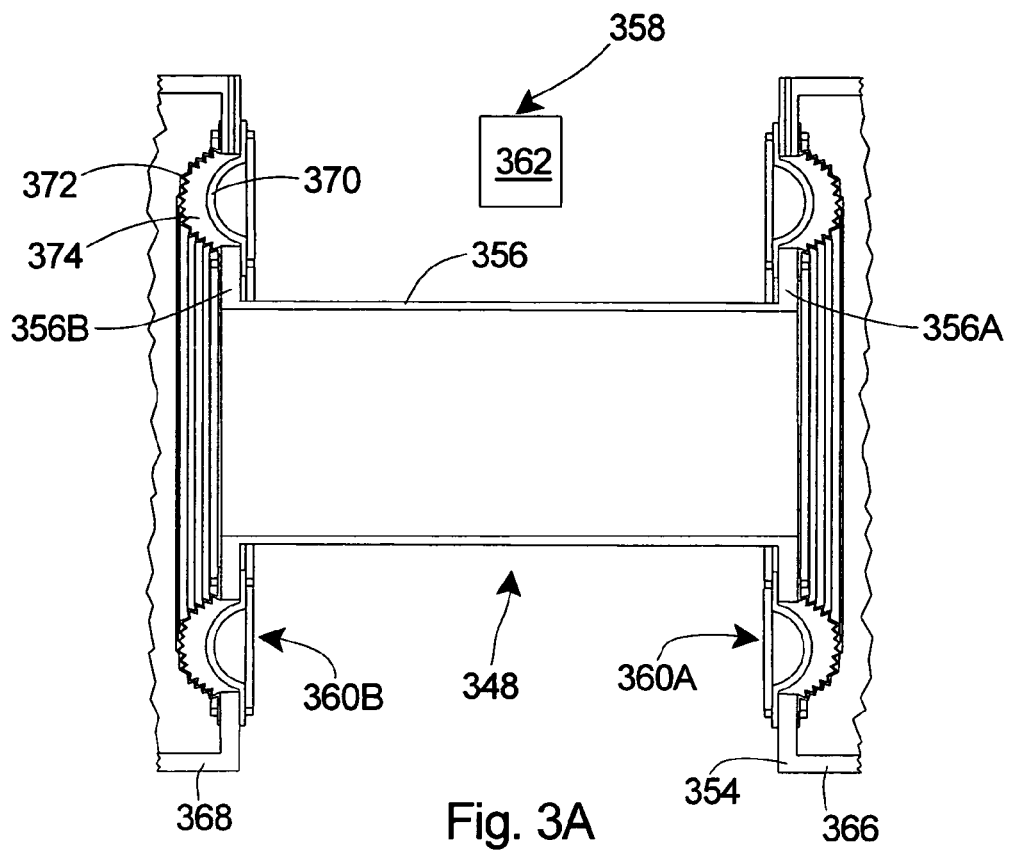
FIG. 3A is a cut-away view of another embodiment of a portion of a first assembly, a portion of a second assembly, and a connector assembly having features of the present invention.

FIG. 3A is a cut-away view of another embodiment of a portion of a first assembly 366, a portion of a second assembly 368 and a connector assembly 348 having features of the present invention. In this embodiment, for example, (i) the first assembly 366 can be the first reticle chamber assembly 40 (illustrated in FIG. 1) and the second assembly 368 can be the second reticle chamber assembly 42 (illustrated in FIG. 1); or (ii) the first assembly 366 can be the first wafer chamber assembly 44 (illustrated in FIG. 1) and the second assembly 368 can be the second wafer chamber assembly 46 (illustrated in FIG. 1). In this embodiment, the first assembly 366 and the second assembly 368 each includes a chamber housing 354 having an annular disk shaped attachment region.

In this embodiment, the connector assembly 348 includes an intermediate assembly 356, and a barrier assembly 358. Further, the intermediate assembly 356 is a generally annular tube shaped and includes an annular disk shaped first end 356A and an annular disk shaped second end 356B. Further, in this embodiment, the barrier assembly 358 includes a first barrier subassembly 360A, a second barrier subassembly 360B, and a barrier source 362 that are somewhat similar to the corresponding components described above. Alternatively, for example, the connector assembly 348 could be designed without the intermediate assembly 356, the first barrier subassembly 360A, the second barrier subassembly 360B, and/or the barrier source 362.

In this embodiment, each barrier subassembly 360A, 360B includes a first barrier 370, and a spaced second barrier 372. In this embodiment, the first barrier 370 and the second barrier 372 extend across the assembly gap 374. In FIG. 3A, the first barrier 370 and the second barrier 372 are each somewhat annular disk shaped and the barriers 370, 372 are positioned somewhat side by side.

It should be noted that the orientation of the barriers 370, 372 illustrated in FIG. 3A can enhance the lateral compliance of the connector assembly 348 and allow for increased relative motion of the assemblies 366, 368 in a direction axial to the centerline of the intermediate assembly 356.

Figure 3B:
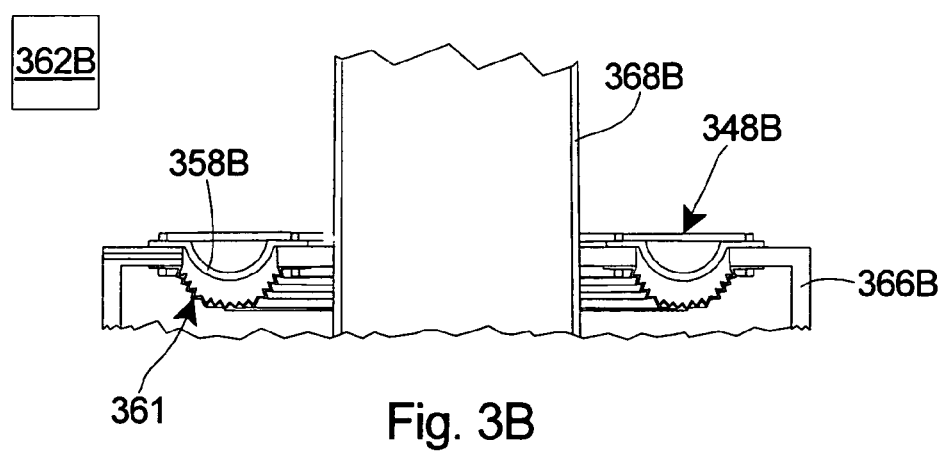
FIG. 3B is a cut-away view of still another embodiment of a portion of a first assembly, a portion of a second assembly, and a connector assembly having features of the present invention.

FIG. 3B is a cut-away view of another embodiment of a portion of a first assembly 366B, a portion of a second assembly 368B, and a connector assembly 348B having features of the present invention. In this embodiment, for example, (i) the first assembly 366B can be the first reticle chamber assembly 40 (illustrated in FIG. 1) and the second assembly 368B can be the illumination system 14 (illustrated in FIG. 1) or the optical assembly 16 (illustrated in FIG. 1); or (ii) the first assembly 366B can be the first wafer chamber assembly 44 (illustrated in FIG. 1) and the second assembly 368B can be the optical assembly 16 (illustrated in FIG. 1).

In this embodiment, the connector assembly 348B includes a barrier assembly 358B. Further, in this embodiment, the barrier assembly 358B includes only one barrier subassembly 361 and a barrier source 362B that are somewhat similar to the corresponding components described above.

Figure 4A:
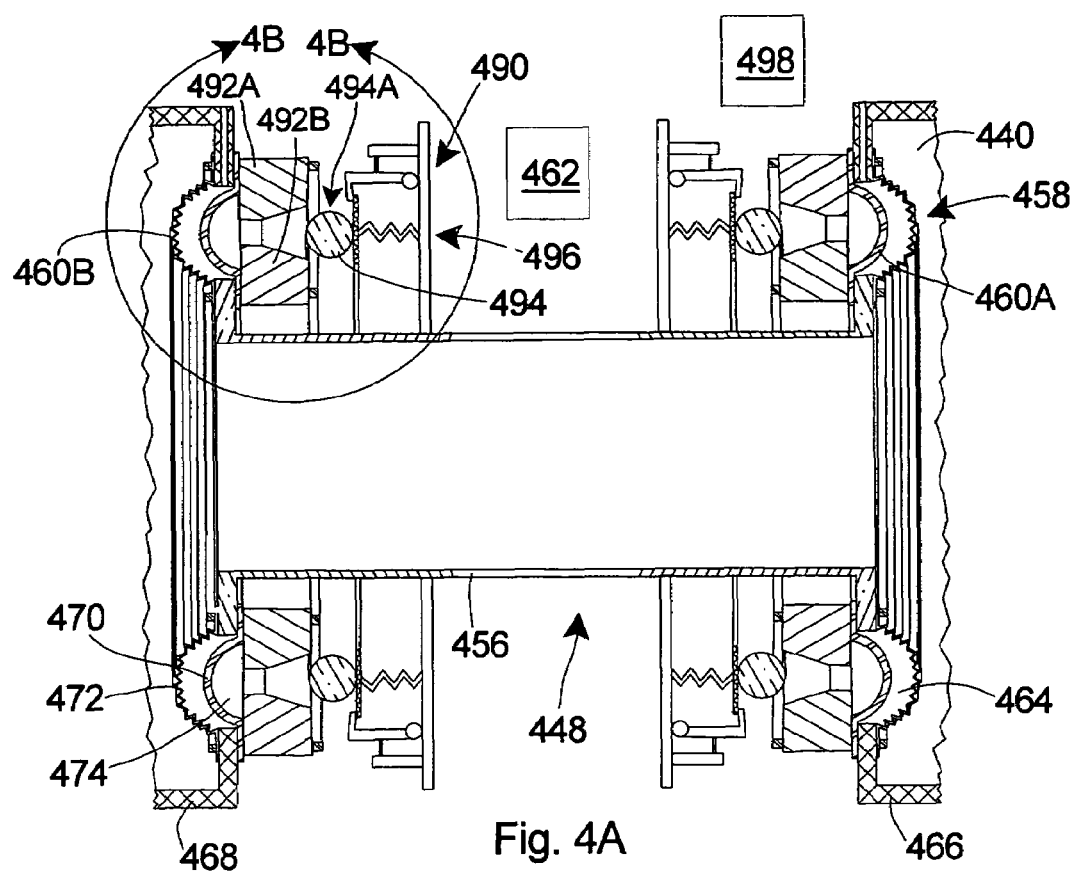
FIG. 4A is a cut-away view of yet another embodiment of a portion of a first assembly, a portion of a second assembly, and a connector assembly having features of the present invention.
Figure 4B:
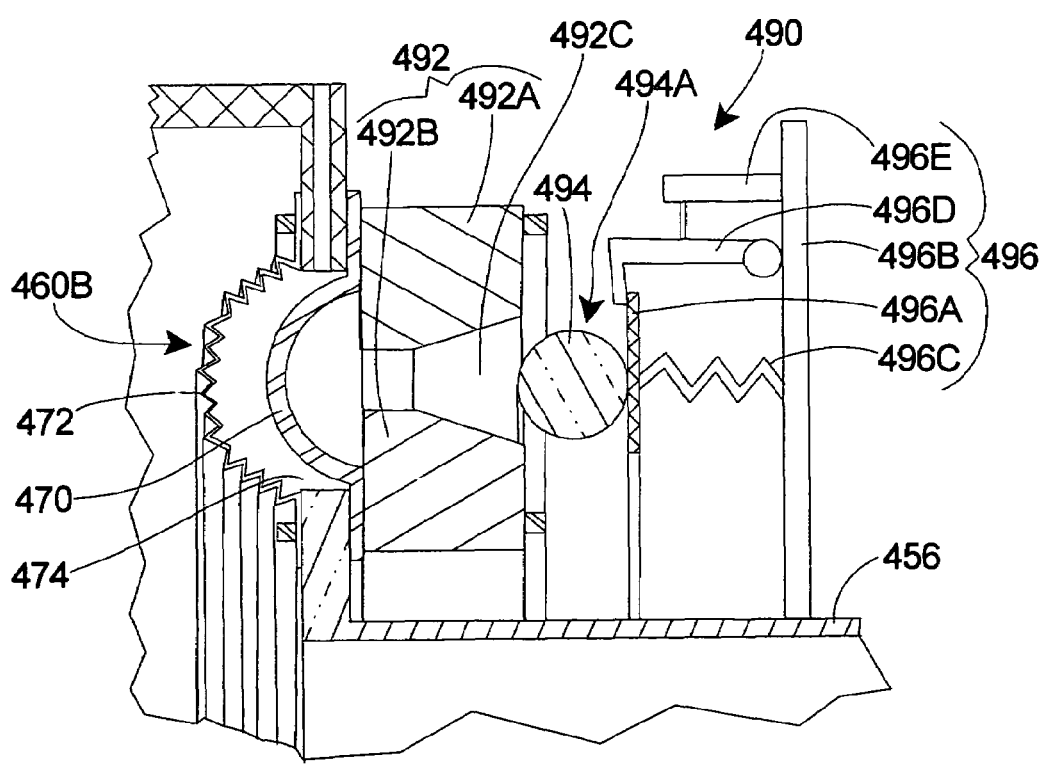
FIG. 4B is an enlarged view taken on line 4B in FIG. 4A.
Figure 4C:
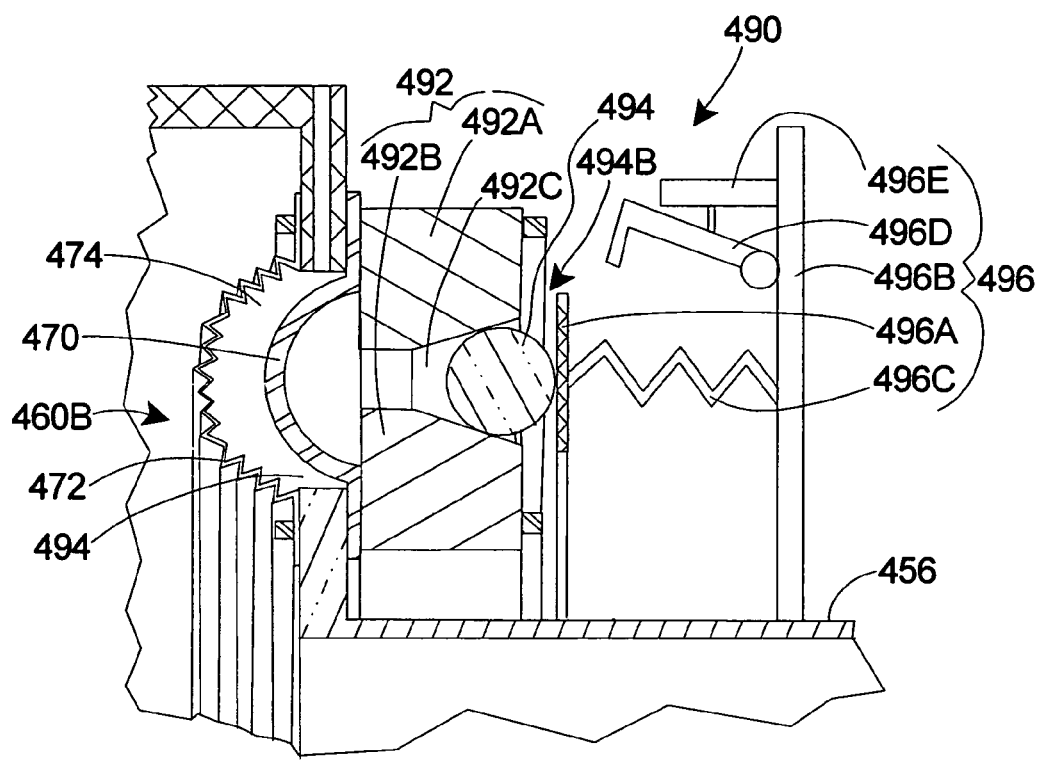
FIG. 4C is an enlarged view similar to that of FIG. 4B with a portion moved.

FIG. 4A is a cut-away view of another embodiment of a portion of a first assembly 466, a portion of a second assembly 466 and a connector assembly 448 that are similar to the corresponding components described above and illustrated in FIG. 3A. FIG. 4B is an enlarged cut-away view taken from FIG. 4A and FIG. 4C is an alternative enlarged cut-away view.

In this embodiment, for example, (i) the first assembly 466 can be the first reticle chamber assembly 40 (illustrated in FIG. 1) and the second assembly 468 can be the second reticle chamber assembly 42 (illustrated in FIG. 1); or (ii) the first assembly 466 can be the first wafer chamber assembly 44 (illustrated in FIG. 1) and the second assembly 468 can be the second wafer chamber assembly 46 (illustrated in FIG. 1).

In this embodiment, the connector assembly 448 includes an intermediate assembly 456, and a barrier assembly 458. Further, the barrier assembly 458 includes a first barrier subassembly 460A, a second barrier subassembly 460B, and a barrier source 462.

In this embodiment, each barrier subassembly 460A, 460B includes a first barrier 470, a spaced second barrier 472, and a seal assembly 490. In this embodiment, the first barriers 470, 472 extend across the assembly gap 474 and are similar to the corresponding components described above.

In one embodiment, the seal assembly 490 seals the assembly gap 474 in the event that one or both of the barriers 470, 472 fails. In one embodiment, the seal assembly 490 includes seal frame 492, a seal 494, and a seal mover 496 that moves the seal 494 from a first position 494A (illustrated in FIGS. 4A and 4B) in which the seal 494 engages the seal frame 492 and seals the assembly gap 474 and a second position 494B (illustrated in FIG. 4C) in which the seal 494 does not engage the seal frame 492 and does not seal the assembly gap 474.

In the embodiment illustrated in FIGS. 4A-4C, the seal frame 492 includes an annular ring shaped, first frame 492A and a spaced apart, annular ring shaped, second frame 492B. In this embodiment, the frames 492A, 492B are secured to the first barrier 470 on opposite sides of the assembly gap 474. Further, the frames 492A, 492B cooperate to form a somewhat annular shaped frame opening 492C that has a somewhat "V" shaped cross-section.

The seal 494 is used to selectively seal the frame opening 492C. In the embodiment, illustrated in FIGS. 4A-4C, the seal 494 is an "O" ring type seal having a generally circular cross-section. Alternatively, the seal 494 can have another shape. The seal 494 can be made of a resilient material.

The seal mover 496 moves the seal 494 between the first position 494A and the second position 494B. In one embodiment, the seal mover 496 includes (i) an annular shaped retainer ring 496A that retains the seal 494, (ii) one or more mover frames 496B that cantilever away from the intermediate assembly 456, (iii) one or more resilient members 496C, e.g. springs that urge the seal 494 from the second position 494B towards the first position 494A, (iv) one or more frame retainers 496D that selectively retain the seal 494 in the first position 494A, and (v) one or more retainer movers 496E, e.g. an electric motor, that move the frame retainers 496D. The control system 24 (illustrated in FIG. 1) can control the operation of the retainer movers 496E.

In this embodiment, each frame retainer 496D is rotatably connected to the mover frames 496B. Further, the frame retainer 496D can include a hook that selectively engages the retainer ring 496A.

Additionally, the seal assembly 490 can include a sensor 498 (illustrated in FIG. 4A) that can detect when one of the barriers 470, 472 fails. For example, the sensor 498 can detect a pressure change in the barrier chamber 464 or the assembly chamber 440. Alternatively, the sensor 498 can detect a level of contaminants in the assembly chamber 440. The sensor 490 can be electronically connected to the control system 24.

In an alternative embodiment, for example, an electric motor (not shown) could directly move the seal 494 between the first position 494A and the second position 494B.

Figure 4D:
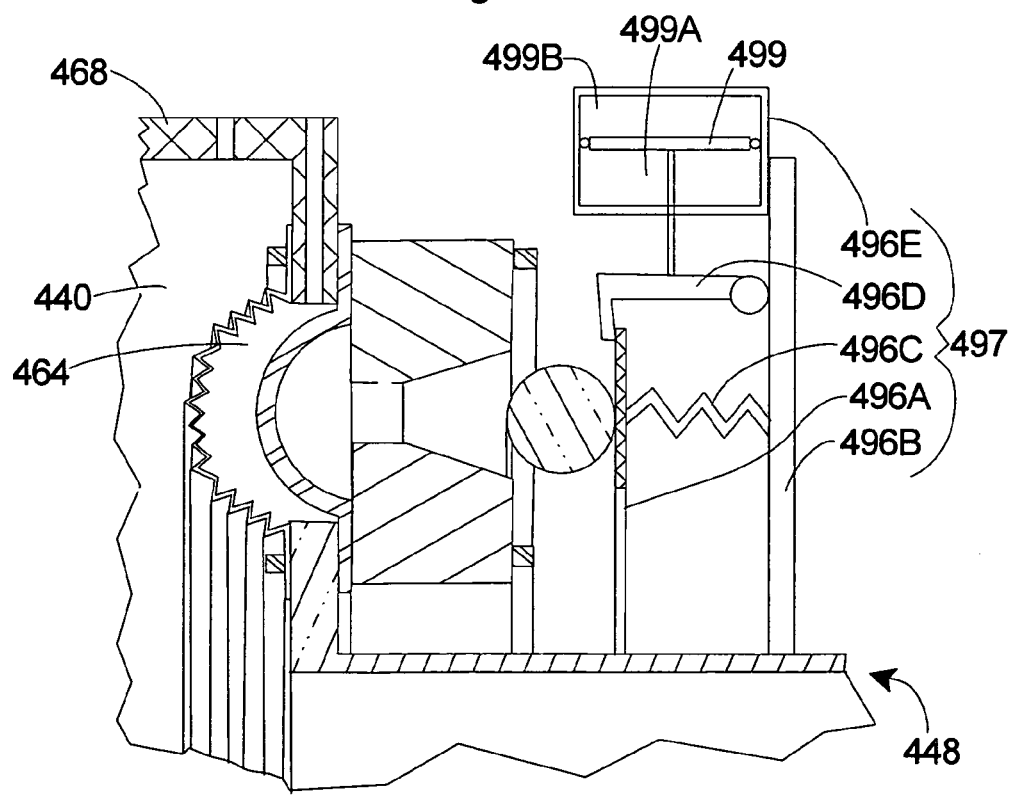
FIG. 4D is a cut-away view of still another embodiment of a portion of a first assembly, and a portion of a connector assembly having features of the present invention.

FIG. 4D illustrates a cut-away view of yet another embodiment of a portion of a second assembly 468, and a portion of a connector assembly 448 that are similar to the corresponding components described above and illustrated in FIGS. 4A-4C. However, in this embodiment, the seal mover 497 is slightly different. In this embodiment, the seal mover 497 includes (i) the retainer ring 496A, (ii) the one or more mover frames 496B, (iii) one or more resilient members 496C, (iv) one or more frame retainers 496D, and (v) one or more retainer movers 496E.

However, in this embodiment, the retainer movers 496E are slightly different. In particular, in this embodiment, each retainer mover 496E is a piston type mover that includes a piston 499 that is coupled to the frame retainer 496D. In this design, a first chamber 499A is positioned on a first side of the piston 499 and a second chamber 499B is positioned on a second side of the piston 499. Further, the first chamber 499A is in fluid communication with the barrier chamber 464 and the second chamber 499B is in fluid communication with the assembly chamber 440. In this design, if the pressure in the barrier chamber 464 becomes greater than the pressure in the assembly chamber 440, there will be a pressure differential across the piston 499 and the piston 499 will move the frame retainers 496D.

Figure 5A:
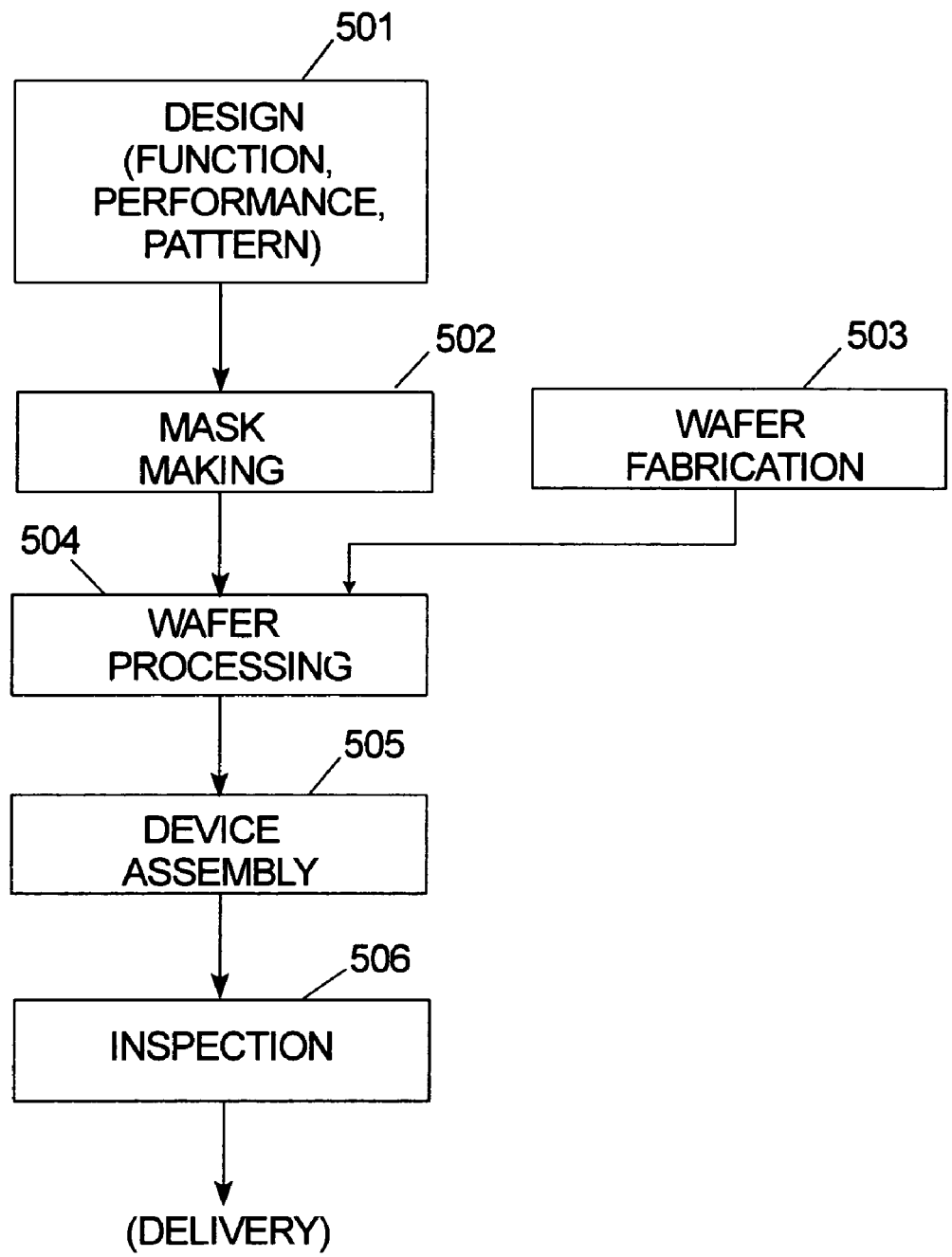
FIG. 5A is a flow chart that outlines a process for manufacturing a device in accordance with the present invention.

Semiconductor devices can be fabricated using the above described systems, by the process shown generally in FIG. 5A. In step 501 the device's function and performance characteristics are designed. Next, in step 502, a mask (reticle) having a pattern is designed according to the previous designing step, and in a parallel step 503 a wafer is made from a silicon material. The mask pattern designed in step 502 is exposed onto the wafer from step 503 in step 504 by a photolithography system described hereinabove in accordance with the present invention. In step 505 the semiconductor device is assembled (including the dicing process, bonding process and packaging process), finally, the device is then inspected in step 506.

Figure 5B:
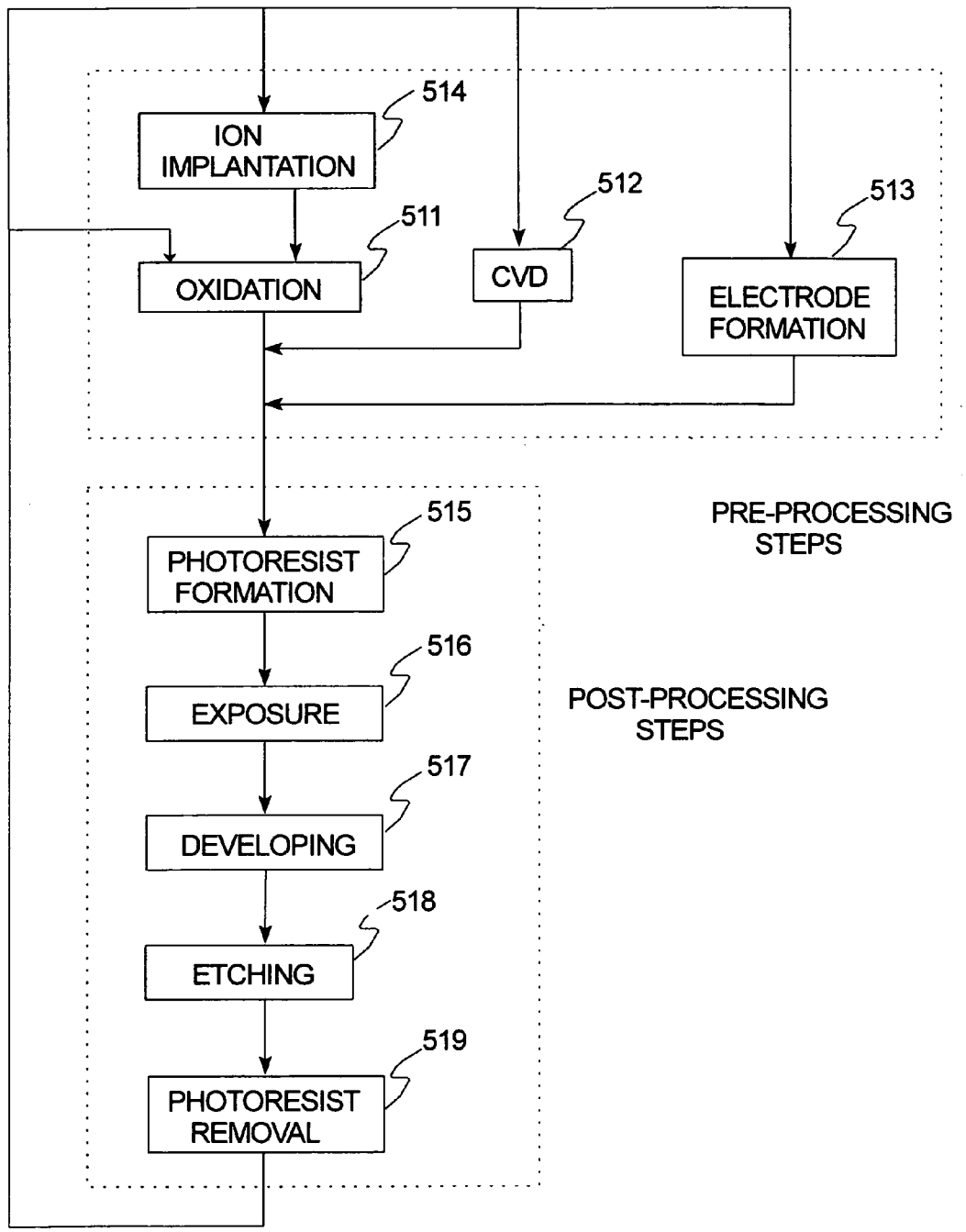
FIG. 5B is a flow chart that outlines device processing in more detail.

FIG. 5B illustrates a detailed flowchart example of the above-mentioned step 504 in the case of fabricating semiconductor devices. In FIG. 5B, in step 511 (oxidation step), the wafer surface is oxidized. In step 512 (CVD step), an insulation film is formed on the wafer surface. In step 513 (electrode formation step), electrodes are formed on the wafer by vapor deposition. In step 514 (ion implantation step), ions are implanted in the wafer. The above mentioned steps 511-514 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 515 (photoresist formation step), photoresist is applied to a wafer. Next, in step 516 (exposure step), the above-mentioned exposure device is used to transfer the circuit pattern of a mask (reticle) to a wafer. Then in step 517 (developing step), the exposed wafer is developed, and in step 518 (etching step), parts other than residual photoresist (exposed material surface) are removed by etching. In step 519 (photoresist removal step), unnecessary photoresist remaining after etching is removed.

Multiple circuit patterns are formed by repetition of these preprocessing and post-processing steps.

While the particular exposure apparatus 10 as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A barrier assembly for sealing an assembly gap between a first assembly and a second assembly, the barrier assembly comprising:
   a flexible first barrier that extends across the assembly gap between the first assembly and the second assembly;
   a flexible second barrier that extends across the assembly gap between the first assembly and the second assembly, the second barrier being made of a different material than the first barrier, wherein the second barrier is spaced apart from the first barrier, and wherein the first barrier and the second barrier cooperate to form at least a portion of an enclosed barrier chamber that is located between the first barrier and the second barrier; and
   a barrier source that is in communication with the barrier chamber, the barrier source adding or removing a fluid from the barrier chamber to control a barrier environment in the barrier chamber between the barriers.

2. The barrier assembly of claim 1 wherein the first barrier provides a flexible pressure barrier that seals the first assembly relative to the second assembly.

3. The barrier assembly of claim 2 wherein the second barrier provides a flexible barrier that inhibits the first barrier from contaminating an environment contained in the assemblies.

4. The barrier assembly of claim 1 wherein the second barrier provides a flexible barrier that inhibits the first barrier from contaminating an environment contained in the assemblies.

5. The barrier assembly of claim 1 further comprising a safety seal for selectively sealing the assembly gap.

6. An exposure apparatus for transferring an image to a device, the exposure apparatus comprising: a stage assembly that moves the device and an environmental system that controls an environment around the device, the environmental system including a first assembly that is positioned around the device, a second assembly, and the barrier assembly of claim 1.

7. The barrier assembly of claim 1 wherein the first barrier substantially encircles the second barrier.

8. The barrier assembly of claim 1 wherein the first barrier and the second barrier are positioned substantially side by side.

9. The barrier assembly of claim 1 wherein the first barrier outgases and the second barrier does not outgas.

10. The barrier assembly of claim 1 wherein the barrier source includes a fluid pump.

11. The barrier assembly of claim 1 wherein the barrier source includes a fluid reservoir.

12. A barrier assembly for sealing an assembly gap between a first assembly and a second assembly, the barrier assembly comprising:
a flexible first barrier that extends across the assembly gap between the first assembly and the second assembly;
a flexible second barrier that extends across the assembly gap between the first assembly and the second assembly, the second barrier being made of a different material than the first barrier, wherein the second barrier is spaced apart from the first barrier, and wherein the first barrier and the second barrier cooperate to form at least a portion of an enclosed barrier chamber that is located between the first barrier and the second barrier; and
a barrier source that controls a barrier environment in the barrier chamber between the barriers; wherein the barrier source controls a barrier pressure in the barrier chamber between the barriers so that the barrier pressure is within approximately 1 PSI of a chamber pressure in the first and second assemblies.

13. A barrier assembly for sealing an assembly gap between a first assembly and a second assembly, the barrier assembly comprising:
a flexible first barrier that extends across the assembly gap between the first assembly and the second assembly; wherein the first barrier is made of a resilient material;
a flexible second barrier that extends across the assembly gap between the first assembly and the second assembly, the second barrier being made of a different material than the first barrier, wherein the second barrier is spaced apart from the first barrier, and wherein the first barrier and the second barrier cooperate to form at least a portion of an enclosed barrier chamber that is located between the first barrier and the second barrier; and wherein the second barrier includes a metallic material; and
a barrier source that controls a barrier environment in the barrier chamber between the barriers.

14. A barrier assembly for sealing an assembly gap between a first assembly and a second assembly, the barrier assembly comprising:
a flexible first barrier that extends across the assembly gap between the first assembly and the second assembly, wherein the first barrier is made of a resilient material; and
a flexible second barrier that extends across the assembly gap between the first assembly and the second assembly, wherein the second barrier includes a metallic material, wherein the second barrier is spaced apart from the first barrier, and wherein the first barrier and the second barrier cooperate to form at least a portion of an enclosed barrier chamber that is located between the first barrier and the second barrier.

15. A method for sealing an assembly gap between a first assembly and a second assembly, the method comprising the steps of:
sealing the assembly gap with a flexible first barrier that extends across the assembly gap between the first assembly and the second assembly;
sealing the assembly gap with a flexible second barrier that extends across the assembly gap between the first assembly and the second assembly, the second barrier being made of a different material than the first barrier, wherein the second barrier is spaced apart from the first barrier, and wherein the first barrier and the second barrier cooperate to form at least a portion of a substantially sealed barrier chamber that is located between the first barrier and the second barrier; and
controlling a barrier environment in the barrier chamber between the barriers with a barrier source that is in communication with the barrier chamber, the barrier source adding or removing a fluid from the barrier chamber to control the barrier environment.

16. The method of claim 15 wherein the first barrier provides a flexible pressure barrier that seals the first assembly relative to the second assembly and the second barrier provides a flexible barrier that inhibits the first barrier from contaminating an environment contained in the assemblies.

17. The method of claim 15 further comprising the step of controlling a barrier environment between the barriers with a barrier source so that a barrier pressure in the barrier chamber between the barriers is within approximately 1 PSI of a chamber pressure in the first and second assemblies.

18. The method of claim 15 further comprising the step of selectively sealing the assembly gap with a seal.

19. A method for transferring an image to a device, the method comprising the steps of: moving the device with a stage assembly, and controlling an environment around the device with an environmental system, the environmental system including a first assembly that is positioned around the device, and a second assembly spaced apart an assembly gap from the first assembly, and wherein the assembly gap is sealed by the method of claim 15.

20. A method for making a device including the steps of providing a substrate and transferring an image to the device by the method of claim 19.

21. The method of claim 15 wherein the step of controlling includes the barrier source having a fluid pump.

22. The method of claim 15 wherein the step of controlling includes the barrier source having a fluid reservoir.

23. A connector assembly for sealing a first assembly and a second assembly, the connector assembly comprising:
- an intermediate assembly positioned between the first and second assembly, the intermediate assembly having a first end and a second end; and
- a barrier assembly that seals the first end of the intermediate assembly to the first assembly and the second end of the intermediate assembly to the second assembly, wherein the barrier assembly includes a first barrier subassembly and a second barrier subassembly, wherein at least one of the barrier subassemblies includes a flexible first barrier and a flexible second barrier that are spaced apart, and wherein the first barrier and the second barrier cooperate to form at least a portion of a substantially sealed barrier chamber that is located between the first barrier and the second barrier.

24. The connector assembly of claim 23 wherein the second barrier is made of a different material than the first barrier.

25. The connector assembly of claim 24 wherein the first barrier provides a flexible pressure barrier that seals the first assembly relative to the second assembly.

26. The connector assembly of claim 25 wherein the second barrier provides a flexible barrier that inhibits the first barrier from contaminating an environment contained in the assemblies.

27. The connector assembly of claim 24 wherein the second barrier provides a flexible barrier that inhibits the first barrier from contaminating an environment contained in the assemblies.

28. The connector assembly of claim 24 further comprising a barrier source that controls a barrier environment in the barrier chamber between the barriers.

29. The connector assembly of claim 28 wherein the barrier source controls a barrier pressure between the barriers so that the barrier pressure is within approximately 1 PSI of a chamber pressure in the first and second assemblies.

30. An exposure apparatus for transferring an image to a device, the exposure apparatus comprising: a stage assembly that moves the device and an environmental system that controls an environment around the device, the environmental system including a first assembly that is positioned around the device, a second assembly, and the connector assembly of claim 23.

31. The barrier assembly of claim 23 wherein the first barrier substantially encircles the second barrier.

32. The barrier assembly of claim 23 wherein the first barrier and the second barrier are positioned substantially side by side.

33. The connector assembly of claim 23 wherein the first barrier outgases and the second barrier does not outgas.

34. A method for sealing a first assembly to a second assembly, the method comprising the steps of:
- positioning an intermediate assembly between the assemblies, the intermediate assembly having a first end and a second end; and
- sealing the first end of the intermediate assembly to the first assembly with a first barrier subassembly and the second end of the intermediate assembly to the second assembly with a second barrier subassembly, wherein at least one of the barrier subassemblies includes a flexible first barrier and a flexible second barrier that are spaced apart, and wherein the first barrier and the second barrier cooperate to form at least a portion of an enclosed barrier chamber that is located between the first barrier and the second barrier.

35. The method of claim 34 wherein the second barrier is made of a different material than the first barrier.

36. The method of claim 35 wherein the first barrier provides a flexible pressure barrier that seals the first assembly relative to the second assembly and the second barrier provides a flexible barrier that inhibits the first barrier from contaminating an environment contained in the assemblies.

37. The method of claim 35 further comprising the step of controlling a barrier environment in the barrier chamber between the barriers with a barrier source.

38. The method of claim 35 further comprising the step of controlling a barrier environment between the barriers with a barrier source so that a barrier pressure in the barrier chamber between the barriers is within approximately 1 PSI of a chamber pressure in the first and second assemblies.

39. A method for transferring an image to a device, the method comprising the steps of: moving the device with a stage assembly, and controlling an environment around the device with an environmental system, the environmental system including a first assembly that is positioned around the device, and a second assembly, wherein the first assembly is sealed to the second assembly by the method of claim 34.

40. A method for making a device including the steps of providing a substrate and transferring an image to the device by the method of claim 39.

* * * * *